United States Patent
Tanaka

(10) Patent No.: US 10,221,487 B2
(45) Date of Patent: Mar. 5, 2019

(54) METAL FOIL FOR ELECTROMAGNETIC SHIELDING, ELECTROMAGNETIC SHIELDING MATERIAL AND SHIELDED CABLE

(71) Applicant: JX Nippon Mining & Metals Corporation, Tokyo (JP)

(72) Inventor: Koichiro Tanaka, Ibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 239 days.

(21) Appl. No.: 15/314,808

(22) PCT Filed: May 30, 2014

(86) PCT No.: PCT/JP2014/064474
§ 371 (c)(1),
(2) Date: Nov. 29, 2016

(87) PCT Pub. No.: WO2015/181970
PCT Pub. Date: Dec. 3, 2015

(65) Prior Publication Data
US 2018/0216238 A1   Aug. 2, 2018

(51) Int. Cl.
*C23C 28/02* (2006.01)
*C25D 5/12* (2006.01)
(Continued)

(52) U.S. Cl.
CPC ............ *C23C 28/021* (2013.01); *B32B 15/00* (2013.01); *C23C 18/54* (2013.01); *C23C 28/02* (2013.01);
(Continued)

(58) Field of Classification Search
None
See application file for complete search history.

(56) References Cited

U.S. PATENT DOCUMENTS 6,943,288 B1   9/2005   Miska
7,063,767 B1   6/2006   Tyson et al.
(Continued)

FOREIGN PATENT DOCUMENTS

EP   2484812        8/2012
EP   2542043 A1    1/2013
(Continued)

OTHER PUBLICATIONS

Certificate of experimental result submitted at the same time as remarks with Article 34 amendment filed in PCT/JP2014-067333 dated Aug. 18, 2014 (Translation).
(Continued)

*Primary Examiner* — Adam Krupicka
(74) *Attorney, Agent, or Firm* — Jenkins, Wilson, Taylor & Hunt, P.A.

(57) ABSTRACT

A metal foil for electromagnetic shielding 10, comprising a base 1 consisting of a metal foil, an underlayer 2 including Ni formed on one or both surfaces of the base, and a Sn—Ni alloy layer 3 formed on a surface of the underlayer, wherein the Sn—Ni alloy layer includes 20 to 80 weight % of Sn, and when a total deposition amount of Sn is represented by $T_{Sn}$ [μg/dm$^2$], a percentage of Sn in the Sn—Ni alloy is represented by $A_{Sn}$ [weight %], a total deposition amount of Ni is represented by $T_{Ni}$ [μg/dm$^2$], and a percentage of Ni in the Sn—Ni alloy is represented by $A_{Ni}$ [weight %], $T_{Sn}$: 500 to 91000 μg/dm$^2$, $T_{Ni}$: 2200 to 236000 μg/dm$^2$, $170000 => \{T_{Ni} - T_{Sn} \times (A_{Ni}/A_{Sn})\} => 1700$.

7 Claims, 3 Drawing Sheets

(51) Int. Cl.
  *C23C 30/00* (2006.01)
  *H05K 9/00* (2006.01)
  *B32B 15/00* (2006.01)
  *C25D 5/50* (2006.01)
  *C25D 7/06* (2006.01)
  *C23C 18/54* (2006.01)
  *C25D 3/12* (2006.01)
  *C25D 3/32* (2006.01)
  *C25D 3/56* (2006.01)

(52) U.S. Cl.
  CPC ............... *C23C 30/00* (2013.01); *C25D 5/12* (2013.01); *C25D 5/505* (2013.01); *C25D 7/0614* (2013.01); *H05K 9/00* (2013.01); *H05K 9/0088* (2013.01); *C25D 3/12* (2013.01); *C25D 3/32* (2013.01); *C25D 3/562* (2013.01)

(56) References Cited

U.S. PATENT DOCUMENTS

| | | |
|---|---|---|
| 9,485,894 B2 | 11/2016 | Tanaka |
| 2002/0038790 A1 | 4/2002 | Kurii et al. |
| 2013/0192873 A1 | 8/2013 | Orikasa et al. |
| 2016/0165768 A1 | 6/2016 | Tanaka |
| 2016/0374238 A1 | 12/2016 | Tanaka |

FOREIGN PATENT DOCUMENTS

| | | |
|---|---|---|
| EP | 2581220 A1 | 4/2013 |
| EP | 3007533 | 4/2016 |
| JP | 2002-088496 | 3/2002 |
| JP | 2003-201597 | 7/2003 |
| JP | 2005-281794 | 10/2005 |
| JP | 2008-199051 | 8/2008 |
| JP | 2008-274417 | 11/2008 |
| JP | 2010-236041 | 10/2010 |
| JP | 2012/020528 A | 2/2012 |
| JP | 2012-199291 | 10/2012 |
| JP | 2013-007092 | 1/2013 |
| JP | 5497949 B1 | 5/2014 |
| JP | 5534627 B1 | 7/2014 |
| TW | M244724 | 9/2004 |
| WO | WO 2009/144973 | 12/2009 |
| WO | WO 2011/040280 | 4/2011 |
| WO | WO-2012/036200 A1 | 3/2012 |
| WO | WO-2013/105520 A1 | 7/2013 |
| WO | WO 2015/001817 A1 | 1/2015 |
| WO | WO 2015/002130 A1 | 1/2015 |

OTHER PUBLICATIONS

Communication of the Extended European Search Report corresponding to European patent application No. PCT/JP2014067333 dated Feb. 28, 2017.
Communication of the Extended European Search Report corresponding to European patent application No. PCT/JP2014053976 dated Mar. 1, 2017.
International Search Report corresponding to International Application No. PCT/JP2014/053976 dated Apr. 1, 2014.
International Search Report corresponding to Japanese Application No. PCT/JP2014/064474 dated Aug. 19, 2014.
International Search Report corresponding to International Application No. PCT/JP2014/067333 dated Sep. 30, 2014.
JIS-Z2371 (1994) Methods of Neutral Salt Spray Testing. Japanese Industrial Standard 1-25.
Notification of Transmittal of Translation of the International Preliminary Report on Patentability (Chapter I or Chapter II) corresponding to International Application No. PCT/JP2014/053976 dated Jan. 14, 2016.
Notification of Transmittal of Translation of the International Preliminary Report on Patentability corresponding to International Application No. PCT/JP2014/067333 dated Jan. 7, 2016.
Notification of Transmittal of Translation of the International Preliminary Report on Patentability corresponding to Japanese Application No. PCT/JP2014/064474 dated Dec. 1, 2016.
Notice of Allowance corresponding to U.S. Appl. No. 14/902,188 dated Jul. 6, 2016.
Remarks submitted with Article 34 filed in PCT/JP2014-06733 [undated] (Translation).
Office Action corresponding to U.S. Appl. No. 14/902,198 dated Oct. 5, 2017.
European Search Report corresponding to European Patent Application No. 14893424.3-1103/3150746 PCT/JP2014064474 dated Jun. 4, 2018.
Office Action corresponding to U.S. Appl. No. 14/902,198 dated Jul. 25, 2018.

[Fig.1]
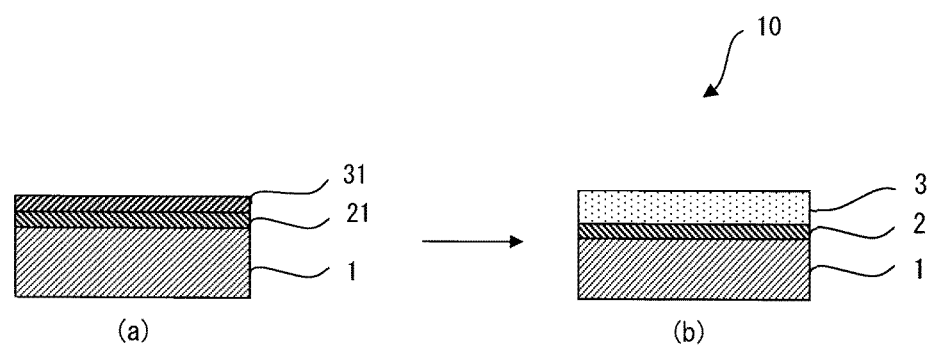
[Fig.2]
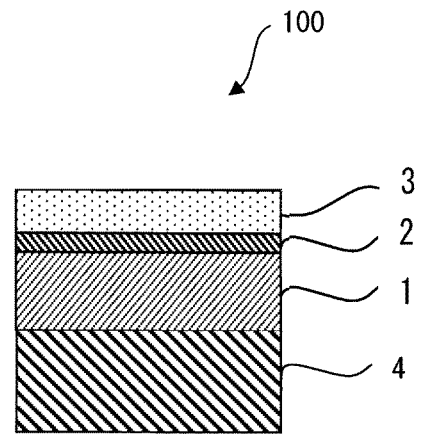

[Fig.3]
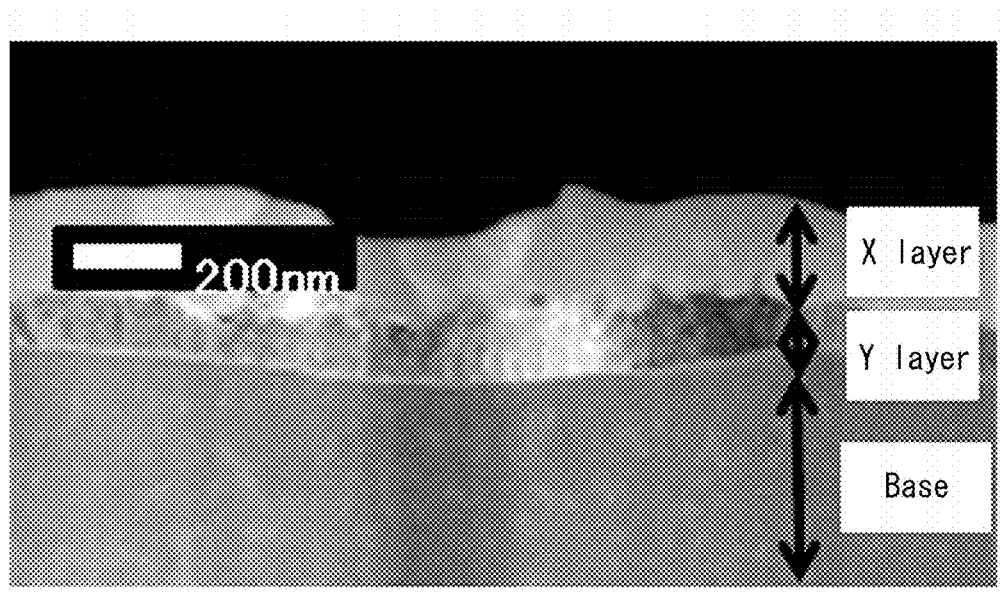

[Fig.4]
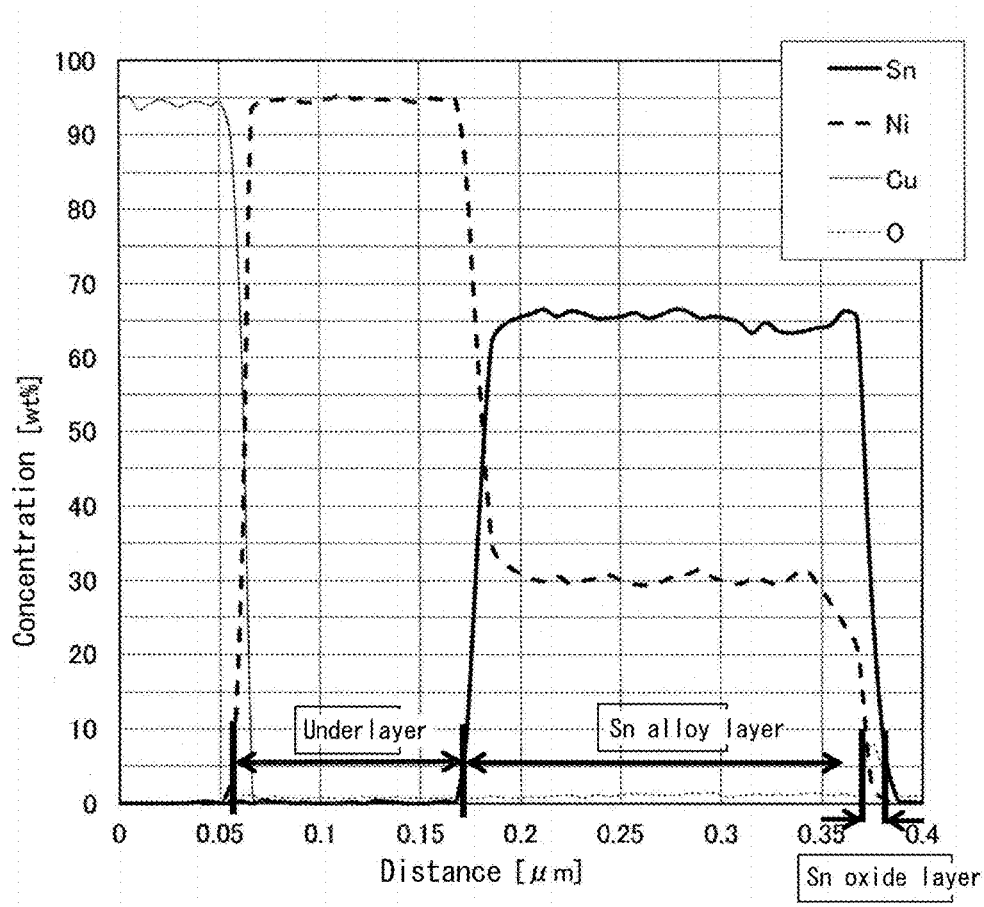

METAL FOIL FOR ELECTROMAGNETIC SHIELDING, ELECTROMAGNETIC SHIELDING MATERIAL AND SHIELDED CABLE

FIELD OF THE INVENTION

The present invention relates to a metal foil used for an electromagnetic shielding material on which a resin layer or a resin film is laminated, an electromagnetic shielding material and a shielded cable using the same.

DESCRIPTION OF THE RELATED ART

A Sn plated coating has characteristics that corrosion resistance is excellent, soldering property is good, and contact resistance is low. Accordingly, a metal foil such as copper is Sn-plated used as a composite material of an in-vehicle electromagnetic shielding material.

The above-described composite material has a structure that a resin layer or a film is laminated on one surface of a base including copper or a copper alloy metal foil, and a Sn plated coating is formed on the other surface (see Patent Literature 1).

Alternatively, by forming zincate treatment layer, a nickel electroplated layer or a tin electroplated layer, a multiplayer plated aluminum (alloy) foil having improved moisture resistance and corrosion resistance has been developed (see Patent Literature 2).

[Patent Literature 1] International Patent Publication WO 2009/144973

[Patent Literature 2] Japanese Unexamined Patent Publication (Kokai) 2013-007092

Problems to be Solved by the Invention

The reason why the contact resistance of the Sn plated coating is low is that Sn oxide formed by natural oxidation covers a surface of a soft pure Sn layer, the Sn oxide layer is ruptured upon contact with an object, and the pure Sn layer is exposed and directly contacted with the object. Even if an insulation layer such as Sn chloride is formed on the surface of the Sn plated coating by corrosive gas, salt water or the like, the insulation layer is easily ruptured as long as the pure Sn layer remains. Thus, the contact resistance is kept low, and the corrosion resistance is good.

However, as Sn easily forms a compound with a variety of metals, the metal component of the base is easily diffused to a Sn plated coating side even at normal temperature to undesirably form the Sn alloy layer. For example, for an in-vehicle application as described above, an engine compartment of a vehicle is in a high temperature environment as high as 80 to 120° C. The base metal is easily diffused to the Sn plated coating side, and the pure Sn layer disappears. For example, when aluminum or an aluminum alloy is used for the base, aluminum diffused to the Sn layer is easily corroded, thereby impairing the corrosion resistance. In addition, when the base is copper or a copper alloy or when the base has Cu undercoating, Cu is diffused to the Sn layer and a diffused layer grows to an outermost layer. Once the pure Sn layer disappears, the diffused layer is oxidized by atmosphere, Cu oxide is formed on the surface, and the contact resistance is increased.

When the base has Ni undercoating, Ni is diffused to the Sn layer and a diffused layer grows. Once Ni disappears, the effect of the Ni undercoating disappears. When the base that the Ni undercoating disappears is copper or aluminum, the metal of the base is diffused to the surface as described above, the corrosion resistance is decreased, and the contact resistance is increased. Even if the Ni underlayer is thickened, the oxidation of the surface of the Sn layer and the diffusion of Ni to a Sn layer side proceed. When pure Sn disappears, a thick Sn oxide layer is formed, thereby increasing the contact resistance (a final configuration is Ni underlayer+SnNi alloy layer+thick Sn oxide layer).

The present invention is made to solve the above-described problems. An object of the present invention is to provide a metal foil for an electromagnetic shielding material, an electromagnetic shielding material and a shielded cable that corrosion resistance is difficult to be decreased even if it is exposed to high temperature environment and contact resistance is inhibited from increasing.

SUMMARY OF THE INVENTION

As a result of various studies by the present inventors, a metal foil for an electromagnetic shielding material that a component of the meal foil is prevented from diffusing to a Sn—Ni alloy layer side, corrosion resistance is difficult to be decreased even if it is exposed to high temperature environment and contact resistance is inhibited from increasing has been successfully provided by forming an underlayer including Ni on a surface of a metal foil and forming a Sn—Ni alloy layer on a surface of an underlayer.

The Sn—Ni alloy layer has a low contact resistance, and good corrosion resistance. In addition, the alloy already includes Ni, Ni is not diffused to an alloy layer side, and Ni of the underlayer is not consumed. In this way, an effect of the underlayer to prevent the component of the metal foil from diffusing to the alloy layer side is maintained. In particular, when no pure Sn layer is present at the surface of the Sn—Ni alloy layer, the pure Sn layer where Ni is easily diffused is not intervened. Therefore, Ni of the underlayer is prevented from consumed with certainty.

In order to achieve the above-described object, the present invention provides a metal foil for electromagnetic shielding, comprising a base consisting of a metal foil, an underlayer including Ni formed on one or both surfaces of the base, and a Sn—Ni alloy layer formed on a surface of the underlayer, wherein the Sn—Ni alloy layer includes 20 to 80 weight % of Sn, and when a total deposition amount of Sn is represented by $T_{Sn}$ [μg/dm$^2$], a percentage of Sn in the Sn—Ni alloy is represented by $A_{Sn}$ [weight %], a total deposition amount of Ni is represented by $T_{Ni}$ [μg/dm$^2$], and a percentage of Ni in the Sn—Ni alloy is represented by $A_{Ni}$ [weight %], $T_{Sn}$: 500 to 91000 μg/dm$^2$, $T_{Ni}$: 2200 to 236000 μg/dm$^2$, 170000=>{$T_{Ni}$−$T_{Sn}$×($A_{Ni}$/$A_{Sn}$)}=>1700.

Preferably, a pure Sn layer is not present at the surface of the Sn—Ni alloy layer.

Preferably, at least one of the underlayer and the Sn—Ni alloy layer further includes one or more elements selected from the group consisting of P, W, Fe and Co.

Preferably, the Sn—Ni alloy layer includes 10 wt % or less of constituent elements of the base.

Preferably, the base is gold, silver, platinum, stainless steel, iron, nickel, zinc, copper, a copper alloy, aluminum or an aluminum alloy.

Preferably, the base is aluminum or an aluminum alloy, and a Zn layer is formed between the base and the underlayer.

The present invention provides an electromagnetic shielding material, comprising a resin layer laminated on one surface of the metal foil for electromagnetic shielding.

Preferably, the resin layer is a resin film.

The present invention provides a shielded cable shielded by the electromagnetic shielding material.

Effects of the Invention

According to the present invention, there is provided a metal foil for an electromagnetic shielding material that corrosion resistance is difficult to be decreased even if it is exposed to high temperature environment and contact resistance is inhibited from increasing.

BRIEF DESCRIPTION OF DRAWINGS

FIG. 1 A cross-sectional view showing a metal foil for an electromagnetic shielding material according to an embodiment of the present invention.

FIG. 2 A cross-sectional view showing an electromagnetic shielding material according to an embodiment of the present invention.

FIG. 3 A view showing a cross-sectional image of a sample in Example 2 by STEM.

FIG. 4 A view showing a result of a linear analysis of a cross-sectional image of a sample in Example 2 by STEM.

DESCRIPTION OF THE EMBODIMENTS

Hereinafter, embodiments of the present invention will be described. In the present invention, "%" means "weight %" unless otherwise noted.

As shown in FIG. 1(b), a metal foil for an electromagnetic shielding material 10 according to an embodiment of the present invention includes a base 1 consisting of a metal foil, an underlayer 2 formed on one surface of the base 1, and a Sn—Ni alloy layer 3 formed on the underlayer 2.

(Base)

The base 1 may be any metal having a high conductive property that exerts an electromagnetic shielding effect. Examples of the base 1 include gold, silver, platinum, stainless steel, iron, nickel, zinc, copper, a copper alloy, aluminum and an aluminum alloy. Typically, a copper foil or an aluminum foil is common.

A method of forming the base 1 is not especially limited. For example, the base 1 may be formed by rolling, and a foil may be formed by electroplating. Alternatively, a surface of a resin layer or a resin film of an electromagnetic shielding material described later is dry plated to form the base 1.

The thickness of the base 1 may be determined taking the frequency and the skin effect to which the electromagnetic shielding intends into consideration. Specifically, conductivity of elements configuring the base 1 and the aimed frequency are assigned to the following equation (1) to provide a skin depth. The thickness is preferably the skin depth or more. For example, when a copper foil is used as the base 1 and the aimed frequency is 100 MHz, the skin depth is 6.61 μm. Therefore, the thickness of the base 1 is preferably about 7 μm or more. If the base 1 is thicker, flexibility and formability become poor and a raw material cost is increased. The thickness of the base 1 is preferably 100 μm or less, more preferably 4 to 50 μm, still preferably 5 to 25 μm.

$$d = \{2/(2\pi \times f \times \sigma \times \mu)\}^{1/2} \quad (1)$$

d: skin depth (μm)
f: frequency (GHz)
σ: conductivity of conductor (S/m)
μ: magnetic permeability of conductor (H/m)

When the copper foil is used as the base 1, the type of the copper foil is not especially limited. Typically, a rolled copper foil or an electrolytic copper foil may be used. In general, the electrolytic copper foil is produced by electrolytic deposition of copper on a titanium or stainless steel drum from a copper sulfate plating bath or copper cyanide plating bath, and the rolled copper foil is produced by repeating plastic working by a rolling mill roll and a thermal treatment.

As the rolled copper foil, oxygen free copper having a purity of 99.9% or more (JIS-H3100 (C1020)) or tough pitch copper (JIS-H3100 (C1100)) can be used. As the copper alloy foil, a known copper alloy can be used in accordance with strength and conductive property required. As the known copper alloy, a copper alloy including 0.01 to 0.3% tin or a copper alloy including 0.01 to 0.05% silver may be used, for example. In particular, Cu-0.12% Sn or Cu-0.02% Ag each having a good conductive property is often used. For example, the rolled copper foil having conductivity of 5% or more is used. As the electrolytic copper foils, those known can be used.

As the aluminum foil, an aluminum foil having a purity of 99.0% or more can be used. As the aluminum alloy foil, a known aluminum alloy can be used in accordance with strength and conductive property required. Examples of the known aluminum alloy include an aluminum alloy including 0.01 to 0.15% Si and 0.01 to 1.0% Fe or an aluminum alloy including 1.0 to 1.5% Mn.

(Underlayer)

The underlayer 2 consists of Ni. Ni prevents constituent elements of the base from diffusing from the base 1 to the Sn—Ni alloy layer 3. The corrosion resistance is difficult to be decreased even if it is exposed to high temperature environment. For example, when a copper foil is used for the base and Cu is diffused to the Sn—Ni alloy layer 3, Cu within the Sn—Ni alloy layer 3 is oxidized by atmosphere, thereby lowering the heat resistance. When the aluminum foil is used for the base and the Sn—Ni ally layer is tried to be plated on the base, Zn should be firstly displacement plated on the base. Accordingly, Zn is diffused from the Zn plated layer to the Sn—Ni alloy layer 3. In this case, the corrosion resistance to salt water is decreased. Therefore, the underlayer 2 is disposed between the Zn plated layer and the Sn—Ni alloy layer 3 to prevent Zn from diffusing.

The underlayer 2 may further includes one or more elements selected from the group consisting of P, W, Fe and Co (hereinafter these elements are referred to as "a C element group"). When the underlayer 2 includes the C element group, the C element group is diffused to the Sn—Ni alloy layer, thereby improving the corrosion resistance of the Sn—Ni alloy layer 3. A total percentage of the C element group in the underlayer 2 is preferably 1 to 40 weight %, more preferably 5 to 30 weight %.

The thickness of the underlayer 2 is preferably 20 nm or more, more preferably 30 nm or more, most preferably 50 nm or more. If the thickness of the underlayer 2 is less than 20 nm, a diffusion prevention effect of the component of the base may be insufficient. The thicker the underlayer 2 is, the more it is preferable. However, if the underlayer 2 is too thick, the rigidity of the underlayer 2 may be increased excessively, and the formability of metal foil for the electromagnetic shielding may be decreased. Therefore, the thickness of the underlayer 2 is preferably 2000 nm or less.

(Sn—Ni Alloy Layer)

The Sn—Ni alloy layer 3 includes 20 to 80 weight % of Sn. The Sn—Ni alloy layer 3 has high durability to salt water as compared with other Sn-alloy (for example, Sn—Cu alloy) layers.

If the percentage of Sn in the Sn—Ni alloy layer is less than 20 weight %, the corrosion resistance of the alloy layer is decreased. On the other hand, if the percentage of Sn exceeds 80 weight %, Sn oxide is formed excessively on the surface of the alloy layer by heating, and the contact resistance is increased. Also, the diffusion of Ni from the underlayer to the alloy layer proceeds, the underlayer becomes thin, and its barrier effect is degraded.

When a total deposition amount of Sn is represented by $T_{Sn}$ [μg/dm$^2$], the percentage of Sn in the Sn—Ni alloy is represented by $A_{Sn}$ [weight %], a total deposition amount of Ni is represented by $T_{Ni}$ [μg/dm$^2$], and the percentage of Ni in the Sn—Ni alloy is represented by $A_{Ni}$ [weight %], $T_{Sn}$: 500 to 91000 μg/dm$^2$, $T_{Ni}$: 2200 to 236000 μg/dm$^2$, 170000=>{$T_{Ni}$-$T_{Sn}$×($A_{Ni}$/$A_{Sn}$)}=>1700.

If $T_{Sn}$ is less than 500 μg/dm$^2$, the Sn—Ni alloy layer is not sufficiently formed, and the corrosion resistance is poor. If $T_{Sn}$ exceeds 91000 μg/dm$^2$, the Sn—Ni alloy layer becomes too thick, and cannot fully follow the flexibility of the base, thereby easily generating cracks and decreasing the corrosion resistance. If the $T_{Ni}$ is less than 2200 μg/dm$^2$, the Sn—Ni alloy layer or the underlayer are not sufficiently formed, the corrosion resistance is decreased, a diffusion prevention effect by the underlayer may be insufficient. If $T_{Ni}$ exceeds 236000 μg/dm$^2$, the Sn—Ni alloy layer becomes too thick, and cannot fully follow the flexibility of the base, thereby easily generating cracks and decreasing the corrosion resistance.

If {$T_{Ni}$-$T_{Sn}$×($A_{Ni}$/$A_{Sn}$)} is less than 1700, the amount of Sn is excess to the amount of Ni. Therefore, if it is tried to form a Sn—Ni alloy layer alone by the thermal treatment, pure Sn remains. Even if the conditions of the thermal treatment are adjusted so that pure Sn does not remain, the amount of Sn is 80 wt % or more in the Sn—Ni alloy layer. If {$T_{Ni}$-$T_{Sn}$×($A_{Ni}$/$A_{Sn}$)} exceeds 170000, the underlayer becomes too thick, and cannot fully follow the flexibility of the base, thereby easily generating cracks and decreasing the corrosion resistance.

The thickness of the Sn—Ni alloy layer 3 is preferably 30 nm or more, more preferably 50 nm or more, most preferably 70 nm or more. If the thickness of the Sn—Ni alloy layer 3 is less than 30 nm, the corrosion resistance to salt water, NOx, and SOx gas may be insufficient. The thickness of the Sn—Ni alloy layer 3 is preferably 30 nm or more. However, if the Sn—Ni alloy layer 3 is too thick, the rigidity of the Sn—Ni alloy layer may be increased excessively, cracks may be generated, and the corrosion resistance may be decreased. Therefore, the thickness of the Sn—Ni alloy layer 3 is preferably 1500 nm or less.

The thicknesses of the Sn—Ni alloy layer, the underlayer, and the Sn oxide layer described later are determined by performing a linear analysis of a cross section of a sample of a metal foil for electromagnetic shielding by STEM (Scanning Transmission. Electron Microscope). Designated elements to be analyzed are Sn, Ni, P, W, Fe, Co, Zn, C, S, O and those included in the base. In addition, with a total of the above-described designated elements being 100%, a percentage (wt %) of each element in each layer is analyzed (acceleration voltage: 200 kV, measurement interval: 2 nm).

As shown in FIG. 4, the layer including 5 wt % or more of Sn and 5 wt % or more of Ni is taken as the Sn—Ni alloy layer, and the thickness is determined by FIG. 4 (corresponding to a scanning distance of the linear analysis). The layer positioned at a side lower than the Sn alloy layer and including less than 5 wt % of Sn and 5 wt % or more of Ni is taken as the underlayer, and the thickness is determined by FIG. 4. The layer positioned at a side higher than the Sn alloy layer and including 95 wt % or more of Sn is taken as the pure Sn layer, and the thickness is determined by FIG. 4.

The layer positioned at a side higher than the pure Sn layer and including 5 wt % or more of Sn and 5 wt % or more of O is taken as the Sn oxide layer, and the thickness is determined by FIG. 4. The measurement by STEM is performed in 3 field of view, an average value in 3 view×5 points is taken as the thickness of each layer.

Preferably, when the Sn—Ni alloy layer 3 further includes the above-described C element group, the corrosion resistance of the Sn—Ni alloy layer 3 is improved. A total percentage of the C element group in the Sn—Ni alloy layer is preferably 1 to 40 weight %, more preferably 5 to 30 weight %.

The C element group may be included in the Sn—Ni alloy layer 3 itself when the Sn—Ni alloy layer 3 is formed. While the C element group may be included in the underlayer 2, the Sn—Ni alloy layer 3 including no C element group may be formed, and the C element group may be diffused into the Sn—Ni alloy layer 3 by a desired thermal treatment. Alternatively, while the C element group may be included in the underlayer 2, the Sn—Ni alloy layer 3 including no C element group may be formed as it is. In this case, when the metal foil for electromagnetic shielding is used at a high temperature, the C element group may be diffused into the Sn—Ni alloy layer 3.

Preferably, the Sn oxide is formed on the surface of the Sn—Ni alloy layer 3. The Sn oxide has high corrosion resistance. When the Sn oxide is present at the surface of the alloy layer, the corrosion resistance of the alloy layer is further improved.

As shown in FIG. 1(a), when the Sn—Ni alloy layer is formed by heating the second layer 22 including Sn, Sn oxide is formed in the second layer 22 by natural oxidation when the second layer 22 is formed. Even after alloying by heating, the Sn oxide remains in the Sn alloy layer. The Sn oxide has an effect to improve properties such as the corrosion resistance.

The Sn oxide may not be the layer, may be present at the surface of the Sn—Ni alloy layer, and may have the thickness of 1 to 50 nm, preferably 3 to 30 nm, more preferably 5 to 20 nm. The Sn oxide has the contact resistance higher than the Sn—Ni alloy layer. Therefore, when the film thickness exceeds 30 nm, the contact resistance is increased.

(Method of Forming Sn—Ni Alloy Layer)

The Sn—Ni alloy layer can be formed by alloy plating (wet plating), sputtering using an alloy target for the alloy layer, vapor deposition using components for the alloy layer, etc.

As shown in FIG. 1 (a), a first layer 21 including Ni is formed on one surface of a base 1, and a second layer 31 including Sn is formed on the surface of the first layer 21, for example. Thereafter, elements in the first layer 21 and the second layer 31 are alloyed by thermal treatment, thereby forming the Sn—Ni alloy layer 3 shown in FIG. 1(b). However, in this case, a thickness of each layer should be controlled so that the first layer 21 remains after the thermal treatment. The conditions of the thermal treatment are not especially limited, but may be about 2 seconds to 10 hours at 120 to 500° C.

Also, the underlayer 3 and the Sn—Ni alloy layer 2 may be formed by vapor deposition, PVD, CVD, etc. other than the wet plating.

When aluminum or an aluminum alloy foil is used as the base, a zincate treatment layer may be formed between the underlayer 3 and the base 1 as undercoating for Ni plating the underlayer 3.

Next, referring to FIG. 2, an electromagnetic shielding material 100 according to an embodiment of the present invention will be described. The electromagnetic shielding material 100 includes a metal foil 10 for an electromagnetic shielding material and a resin layer or a resin film 4 laminated on one surface of the metal foil 10.

As the resin layer, resin such as polyimide may be used, for example. As the resin film, a film of PET (polyethylene terephthalate) or PEN (polyethylene napthalate) may be used. The resin layer or the resin film may be adhered to the metal foil with an adhesive. Alternatively, molten resin may be casted on the metal foil without using an adhesive. The film may be thermally compression-bonded to the metal foil. Also, as the base, a copper or aluminum layer may be formed directly on the resin film by PVD or CVD. In addition, a thin copper or aluminum layer is formed as a conductive layer on the resin film by PVD or CVD, and a thick metal layer is then formed on the conductive layer by wet plating to form a metallized film. These films may be used.

Known resin layer or resin film may be used. The thickness of the resin layer or the resin film is not especially limited. Those having a thickness, for example, of 1 to 100 μm, preferably 3 to 50 μm may be suitably used. When an adhesive is used, the thickness of the adhesive is 10 μm or less, for example.

From the view point of lightening and thinning of the material, the thickness of the electromagnetic shielding material 100 is preferably 1.0 mm or less, more preferably 0.01 to 0.5 mm.

By wounding the electromagnetic shielding material 100 around a cable, a shielded cable is provided.

EXAMPLES

Next, the present invention is further described below in detail with reference to the following examples, but the present invention is, not, limited to those examples.
(Base)

As the rolled copper foil, a rolled copper foil having a thickness of 8 μm (C1100 manufactured by JX Nippon Mining & Metals Corporation) was used.

As the electrolytic copper foil, an electrolytic copper foil having a thickness of 8 μm that is not roughened (JTC foil manufactured by JX Nippon Mining & Metals Corporation) was used.

As the Cu metallized film, metallizing CCL having a thickness of 8 μm ("MAQINAS" manufactured by JX Nippon Mining & Metals Corporation) was used.

As the aluminum foil, an aluminum foil having a thickness of 12 μm (manufactured by Sun Aluminum Industries KK) was used.

As the Al metallized film, a PET film having a thickness of 12 μm (manufactured by Toyobo Co., Ltd.) on which aluminum is formed at a thickness of 6 μm by vacuum deposition was used.
<Formation of Each Layer>

The underlayer and the SN—Ni alloy layer were formed on one surface of the base. Table 1 shows a method of forming each layer. The composition and the thickness of each of the underlayer, the Sn—Ni alloy layer and the Sn oxide layer are the final values after the thermal treatment, etc.

In Table 1, "plating" refers that the first layer (Ni layer) 21 and the second layer (Sn layer) 31 were plated in this order by the method shown in FIG. 1(a), which were thermally treated under the conditions shown in Table 1. The thermal treatment was all performed under nitrogen atmosphere. In Table 1, "alloy plating" refers that the underlayer is formed by Ni plating, and the Sn—Ni alloy layer is then formed by alloy plating.

In each of Examples 20 to 23, when the first layer (Ni layer) 21 was formed, the Ni alloy plating described below was subjected to include the C element group in the underlayer. Thereafter, the second layer (Sn layer) 31 was plated. Furthermore, the Sn—Ni alloy layer was formed by the thermal treatment shown in Table 1. At this time, the elements (P, W, Fe, Co) other than Ni were diffused from the underlayer. Thus, the alloy layer including three components was formed.

In each of Examples 15 and 16, the Zn layer was formed by displacement plating on the aluminum base. Thereafter, the underlayer and the Sn plating were applied in this order to the Zn layer. Furthermore, the Sn alloy layer was formed by the thermal treatment.

In Comparative Example 7, the Zn layer was formed by displacement plating on the aluminum base. Thereafter, the underlayer was plated on the Zn layer, and Sn was plated on the underlayer. The thermal treatment was not performed.

Each plating was formed under the following conditions:
Ni plating: Ni sulfate bath (Ni concentration: 20 g/L, current density: 2 to 10 A/dm$^2$)
Sn plating: Sn phenol sulfonate bath (Sn concentration: 40 g/L, current density: 2 to 10 A/dm$^2$)
Zn displacement plating: zincate bath (Zn concentration: 15 g/L)
Ni—Sn pyrophosphate bath (Ni concentration: 10 g/L, Sn concentration 10 g/L, current density: 0.1 to 2 A/dm$^2$)
Ni—P: sulfate bath (Ni concentration: 20 g/L, P concentration: 20 g/L, current density: 2 to 4 A/dm$^2$)
Ni—W: sulfate bath (Ni concentration: 20 g/L, W concentration: 20 g/L, current density: 0.1 to 2 A/dm$^2$)
Ni—Fe: sulfate bath (Ni concentration: 20 g/L, Fe concentration: 10 g/L, current density: 0.1 to 2 A/dm$^2$)
Ni—Co: sulfate bath (Ni concentration: 20 g/L, Co concentration: 10 g/L, current density: 0.1 to 2 A/dm$^2$)

In Table 1, "sputtering" refers that Ni and Sn were sputtered in this order, which was subjected to the thermal treatment.

In Table 1, "alloy sputtering" refers that Ni was sputtered to form the underlayer, and a Sn—Ni alloy target material was then sputtered to form the Sn—Ni alloy layer.

As the layer formed by the alloy sputtering had the composition of the alloy layer itself, the thermal treatment was not performed.

The sputtering and the alloy sputtering were performed under the following conditions:
Sputtering apparatus: batch sputtering apparatus (ULVAC, Inc., model MNS-6000)
Sputtering conditions: ultimate vacuum $1.0 \times 10^{-5}$ Pa, sputtering pressure 0.2 Pa, sputtering power 50 W
Target: Ni (purity 3N), Sn (purity 3N), Ni—Sn (Ni:Sn=85:15, 43:57, 60:40, 27:73, 20:80, 15:85 (by weight %))

In Table 1, "vapor deposition" was performed by the following conditions:
Vapor deposition apparatus: vacuum vapor deposition apparatus (ULVAC, Inc., model MB05-1006)
Vapor deposition conditions: ultimate vacuum $5.0 \times 10^{-3}$ Pa, electron beam accelerating voltage 6 kV
Vapor deposition source: Ni (purity 3N), Sn (purity 3N), Cu (purity 3N)
(Identification and Thickness Measurement of Sn Alloy Layer, Underlayer and Sn Oxide Layer)

The linear analysis of the cross section of the sample of the resultant metal foil for electromagnetic shielding was performed by STEM (Scanning Transmission. Electron Microscope, JEM-2100F manufactured by JOEL Ltd.) to determine the layer configuration. The designated elements analyzed were Sn, Ni, the C element group (P, W, Fe, Co), Zn, C, S, O and those included in the base. In addition, with a total of the above-described designated elements being 100%, a percentage (wt %) of each element in each layer was analyzed (acceleration voltage: 200 kV, measurement interval: 2 nm).

As shown in FIG. 4, the layer including 5 wt % or more of Sn and 5 wt % or more of Ni was taken as the Sn—Ni alloy layer, and the thickness was determined by FIG. 4 (corresponding to a scanning distance of the linear analysis). The layer positioned at a side lower than the Sn alloy layer and including less than 5 wt % of Sn and 5 wt % or more of Ni was taken as the underlayer, and the thickness was determined by FIG. 4. The layer positioned at a side higher than the Sn layer and including 5 wt % or more of Sn and 5 wt % or more of O was taken as the Sn oxide layer, and the thickness was determined by FIG. 4. The measurement by STEM was performed in 3 field of view, an average value in 3 view×5 points was taken as the thickness of each layer.

(Evaluation of Contact Resistance and Corrosion Resistance)

The contact resistance of the outermost layer of the resultant metal foil for electromagnetic shielding at the Sn—Ni alloy side was measured before and after the corrosion resistance test (salt water spray test). Similarly, the corrosion resistance test and the contact resistance measurement were performed after the metal foil for electromagnetic shielding was heated under atmosphere at 120° C. for 500 hours.

The contact resistance was measured by a four-terminal method using the electric contact simulator CRS-1 manufactured by Yamazaki Seiki Co., Ltd. Probe: gold probe, contact load: 20 gf, bias current: 10 mA, sliding distance: 1 mm The salt water spray test was conducted in accordance with JIS-Z2371 (temperature: 35° C., salt water component: sodium chloride, salt water concentration: 5 wt %, spray pressure: 98±10 kPa, spray time: 48 h).

The contact resistance was evaluated by the following criteria:
Excellent: less than 20 mΩ of contact resistance
Good: from 20 mΩ to less than 100 mΩ of contact resistance
Bad: 100 mΩ or more of contact resistance When the evaluation of the contact resistance after the salt water spray test was "Good", there is no practical problem. The evaluation before the heating under atmosphere, represents the evaluation of the contact resistance and the corrosion resistance in the state that it is not exposed to high temperature environment. The evaluation after the heating under atmosphere, represents the evaluation of the contact resistance and the corrosion resistance in the state that it is exposed to high temperature environment.

The results obtained are shown in Table 1 and Table 2.

TABLE 1

| | | | | | Underlayer | | | Sn—Ni alloy layer | | | |
| | | | | | | | | | Percentage of each composition | | |
| | Base | Tni (µg/dm2) | TSn (µg/dm2) | {Tni − TSn × (Ani/Asn)} | Composition | Thickness (nm) | C element group (wt %) | Composition | Thickness (nm) | Sn | C element group | Base |
|---|---|---|---|---|---|---|---|---|---|---|---|---|
| Example 1 | Rolled copper foil | 5900 | 11000 | 1800 | Ni | 20 | 0 | SnNi | 200 | 73 | 0 | 2 |
| Example 2 | Rolled copper foil | 13000 | 11000 | 8900 | Ni | 100 | 0 | SnNi | 200 | 73 | 0 | 1 |
| Example 3 | Rolled copper foil | 164100 | 11000 | 160000 | Ni | 1800 | 0 | SnNi | 200 | 73 | 0 | 0 |
| Example 4 | Rolled copper foil | 9500 | 1700 | 8900 | Ni | 100 | 0 | SnNi | 30 | 73 | 0 | 0 |
| Example 5 | Rolled copper foil | 39000 | 81000 | 8900 | Ni | 100 | 0 | SnNi | 1460 | 73 | 0 | 0 |
| Example 6 | Rolled copper foil | 2700 | 2400 | 1800 | Ni | 20 | 0 | SnNi | 43 | 73 | 0 | 2 |
| Example 7 | Rolled copper foil | 190000 | 81000 | 160000 | Ni | 1800 | 0 | SnNi | 1460 | 73 | 0 | 0 |
| Example 8 | Rolled copper foil | 13000 | 11000 | 8900 | Ni | 100 | 0 | SnNi | 200 | 73 | 0 | 0 |
| Example 9 | Rolled copper foil | 13000 | 11000 | 8900 | Ni | 100 | 0 | SnNi | 200 | 73 | 0 | 0 |
| Example 10 | Rolled copper foil | 12000 | 12000 | 8900 | Ni | 100 | 0 | SnNi | 200 | 80 | 0 | 0 |
| Example 11 | Rolled copper foil | 15500 | 8800 | 8900 | Ni | 100 | 0 | SnNi | 200 | 57 | 0 | 0 |
| Example 12 | Rolled copper foil | 18600 | 6500 | 8900 | Ni | 100 | 0 | SnNi | 200 | 40 | 0 | 0 |
| Example 13 | Electrolytic copper foil | 13000 | 11000 | 8900 | Ni | 100 | 0 | SnNi | 200 | 73 | 0 | 0 |
| Example 14 | Metallized Cu | 13000 | 11000 | 8900 | Ni | 100 | 0 | SnNi | 200 | 73 | 0 | 0 |
| Example 15 | Al foil | 13000 | 11000 | 8900 | Ni | 100 | 0 | SnNi | 200 | 73 | 0 | 0 |
| Example 16 | Metallized Al | 13000 | 11000 | 8900 | Ni | 100 | 0 | SnNi | 200 | 73 | 0 | 0 |
| Example 17 | Rolled copper foil | 13000 | 11000 | 8900 | Ni | 100 | 0 | SnNi | 200 | 73 | 0 | 0 |
| Example 18 | Rolled copper foil | 13000 | 11000 | 8900 | Ni | 100 | 0 | SnNi | 200 | 73 | 0 | 0 |
| Example 19 | Rolled copper foil | 13000 | 11000 | 8900 | Ni | 100 | 0 | SnNi | 200 | 73 | 0 | 0 |
| Example 20 | Rolled copper foil | 13000 | 11000 | 8900 | NiP | 100 | 8 | SnNiP | 200 | 71 | 3 | 0 |
| Example 21 | Rolled copper foil | 13000 | 11000 | 8900 | NiW | 100 | 20 | SnNiW | 200 | 62 | 15 | 0 |
| Example 22 | Rolled copper foil | 13000 | 11000 | 8900 | NiFe | 100 | 7 | SnNiFe | 200 | 69 | 5 | 0 |
| Example 23 | Rolled copper foil | 13000 | 11000 | 8900 | NiCo | 100 | 8 | SnNiCo | 200 | 70 | 4 | 0 |
| Comp-Example 1 | Rolled copper foil | 5700 | 11000 | 1600 | Ni | 18 | 0 | SnNi | 200 | 73 | 0 | 35 |
| Comp-Example 2 | Rolled copper foil | 9000 | 480 | 8900 | Ni | 100 | 0 | SnNi | 10 | 73 | 0 | 0 |
| Comp-Example 3 | Rolled copper foil | 900 | 1200 | 440 | Ni | 5 | 0 | SnNi | 25 | 73 | 0 | 28 |
| Comp-Example 4 | Rolled copper foil | 0 | 36500 | — | — | 0 | 0 | SnCu | 120 | 61 | 0 | 0 |
| Comp-Example 5 | Rolled copper foil | 0 | 73000 | — | — | 0 | 0 | SnCu | 100 | 61 | 0 | 0 |
| Comp-Example 6 | Rolled copper foil | 53100 | 73000 | −18900 | Ni | 600 | 0 | SnNi | 70 | 73 | 0 | 0 |
| Comp-Example 7 | Rolled copper foil | 0 | 73000 | — | Cu | 300 | 0 | SnCu | 120 | 61 | 0 | 0 |
| Comp-Example 8 | Al foil | 26600 | 73000 | −4100 | Ni | 300 | 0 | SnNi | 50 | 73 | 0 | 0 |
| Comp-Example 9 | Metallized Cu | 35400 | 0 | — | Ni | 400 | 0 | — | 0 | 0 | 0 | 0 |
| Comp-Example 10 | Metallized Cu | 17000 | 30000 | 8900 | Ni | 200 | 0 | SnNiCu | 400 | 76 | 0 | 0 |
| Comp-Example 11 | Rolled copper foil | 11000 | 12500 | 8900 | Ni | 100 | 0 | SnNi | 200 | 15 | 0 | 0 |

TABLE 1-continued

| | | | | | Underlayer | | | | Sn—Ni alloy layer | | | | |
| | | | | | | | | | | | Percentage of each composition | | |
| | Base | Tni (μg/dm2) | TSn (μg/dm2) | {Tni − TSn × (Ani/Asn)} | Composition | Thickness (nm) | C element group (wt %) | Composition | Thickness (nm) | Sn | C element group | Base |
|---|---|---|---|---|---|---|---|---|---|---|---|---|
| Comp-Example 12 | Rolled copper foil | 23500 | 2600 | 8900 | Ni | 100 | 0 | SnNi | 200 | 85 | 0 | 0 |
| Comp-Example 13 | Rolled copper foil | 240000 | 71000 | 133000 | Ni | 1500 | 0 | SnNi | 2200 | 40 | 0 | 0 |
| Comp-Example 14 | Rolled copper foil | 43000 | 93000 | 8900 | Ni | 100 | 0 | SnNi | 1670 | 73 | 0 | 0 |
| Comp-Example 15 | Rolled copper foil | 186000 | 24000 | 180000 | Ni | 2000 | 0 | SnNi | 430 | 73 | 0 | 0 |
| Comp-Example 16 | Rolled copper foil | 2100 | 1200 | 1800 | Ni | 20 | 0 | SnNi | 18 | 73 | 0 | 0 |

TABLE 2

| | | | | | Contact resistance | | | | | |
| | | | Thermal | | Before heating in air | | | After heating in air | | |
| | Pure Sn layer | Sn oxide layer | Method of forming each layer | Temperature (° C.) | Time | Before corrosion test | | Salt water spray test | | Before corrosion test | | Salt water spray test | |
|---|---|---|---|---|---|---|---|---|---|---|---|---|---|
| Example 1 | 0 | 4 | Plating | 180 | 5 h | 10 | Excellent | 13 | Excellent | 21 | Good | 32 | Good |
| Example 2 | 0 | 5 | Plating | 180 | 5 h | 2 | Excellent | 12 | Excellent | 14 | Excellent | 13 | Excellent |
| Example 3 | 0 | 5 | Plating | 180 | 5 h | 1 | Excellent | 11 | Excellent | 12 | Excellent | 9 | Excellent |
| Example 4 | 0 | 4 | Plating | 180 | 5 h | 13 | Excellent | 22 | Good | 10 | Excellent | 39 | Good |
| Example 5 | 0 | 6 | Plating | 180 | 5 h | 5 | Excellent | 5 | Excellent | 10 | Excellent | 5 | Excellent |
| Example 6 | 0 | 5 | Plating | 180 | 5 h | 13 | Excellent | 28 | Good | 21 | Good | 32 | Good |
| Example 7 | 0 | 5 | Plating | 180 | 5 h | 8 | Excellent | 9 | Excellent | 7 | Excellent | 9 | Excellent |
| Example 8 | 0 | 3 | Plating | 300 | 3 sec | 2 | Excellent | 12 | Excellent | 14 | Excellent | 13 | Excellent |
| Example 9 | 0 | 6 | Plating | 120 | 24 h | 2 | Excellent | 12 | Excellent | 14 | Excellent | 13 | Excellent |
| Example 10 | 0 | 1 | Alloy sputtering | No | | 12 | Excellent | 27 | Good | 14 | Excellent | 38 | Good |
| Example 11 | 0 | 1 | Alloy sputtering | No | | 18 | Excellent | 24 | Good | 7 | Excellent | 34 | Good |
| Example 12 | 0 | 1 | Alloy sputtering | No | | 17 | Excellent | 24 | Good | 6 | Excellent | 32 | Good |
| Example 13 | 0 | 5 | Plating | 180 | 5 h | 1 | Excellent | 11 | Excellent | 12 | Excellent | 9 | Excellent |
| Example 14 | 0 | 5 | Plating | 180 | 5 h | 3 | Excellent | 13 | Excellent | 6 | Excellent | 7 | Excellent |
| Example 15 | 0 | 4 | Plating | 180 | 5 h | 2 | Excellent | 15 | Excellent | 10 | Excellent | 12 | Excellent |
| Example 16 | 0 | 5 | Plating | 180 | 5 h | 8 | Excellent | 11 | Excellent | 12 | Excellent | 13 | Excellent |
| Example 17 | 0 | 1 | Alloy plating | No | | 14 | Excellent | 22 | Good | 14 | Excellent | 37 | Good |
| Example 18 | 0 | 1 | Alloy sputtering | No | | 7 | Excellent | 29 | Good | 18 | Excellent | 38 | Good |
| Example 19 | 0 | 5 | Sputtering | 180 | 5 h | 11 | Excellent | 11 | Excellent | 12 | Excellent | 9 | Excellent |
| Example 20 | 0 | 5 | Plating | 180 | 5 h | 26 | Good | 57 | Good | 24 | Good | 55 | Good |
| Example 21 | 0 | 4 | Plating | 180 | 5 h | 27 | Good | 59 | Good | 28 | Good | 51 | Good |
| Example 22 | 0 | 5 | Plating | 180 | 5 h | 27 | Good | 52 | Good | 29 | Good | 52 | Good |
| Example 23 | 0 | 5 | Plating | 180 | 5 h | 22 | Good | 55 | Good | 21 | Good | 59 | Good |
| Comp-Example 1 | 0 | 4 | Plating | 180 | 5 h | 31 | Good | 86 | Good | 2000 or more | Bad | 2000 or more | Bad |
| Comp-Example 2 | 0 | 5 | Plating | 180 | 5 h | 35 | Good | 1200 | Bad | 81 | Good | 2000 or more | Bad |
| Comp-Example 3 | 0 | 5 | Plating | 180 | 5 h | 200 | Bad | 2000 or more | Bad | 2000 or more | Bad | 2000 or more | Bad |
| Comp-Example 4 | 920 | 1 | Plating | No | | 2 | Excellent | 12 | Excellent | 1200 | Bad | 1400 | Bad |
| Comp-Example 5 | 930 | 2 | Plating | No | | 5 | Excellent | 8 | Excellent | 21 | Good | 130 | Bad |
| Comp-Example 6 | 960 | 1 | Plating | No | | 1 | Excellent | 7 | Excellent | 180 | Bad | 220 | Bad |
| Comp-Example 7 | 920 | 2 | Plating | No | | 3 | Excellent | 6 | Excellent | 27 | Good | 150 | Bad |
| Comp-Example 8 | 950 | 2 | Plating | No | | 7 | Excellent | 7 | Excellent | 220 | Bad | 490 | Bad |
| Comp-Example 9 | 0 | 1 | Vapor deposition | No | | 22 | Good | 210 | Bad | 320 | Bad | 520 | Bad |
| Comp-Example 10 | 0 | 1 | Vapor deposition | No | | 11 | Excellent | 26 | Good | 2000 or more | Bad | 2000 or more | Bad |
| Comp-Example 11 | 0 | 1 | Alloy sputtering | No | | 9 | Excellent | 250 | Bad | 2000 or more | Bad | 2000 or more | Bad |

TABLE 2-continued

| | Pure Sn layer | Sn oxide layer | Method of forming each layer | Thermal Temperature (° C.) | Time | Contact resistance | | | | |
|---|---|---|---|---|---|---|---|---|---|---|
| | | | | | | Before heating in air | | After heating in air | | |
| | | | | | | Before corrosion test | Salt water spray test | | Before corrosion test | Salt water spray test |
| Comp-Example 12 | 0 | 1 | Alloy sputtering | No | | 8 Excellent | 24 Good | | 180 Bad | 330 Bad |
| Comp-Example 13 | 0 | 9 | Plating | 180 | 5 h | 3 Excellent | 1100 Bad | | 7 Excellent | 1800 Bad |
| Comp-Example 14 | 0 | 8 | Plating | 180 | 5 h | 4 Excellent | 800 Bad | | 12 Excellent | 2000 or more Bad |
| Comp-Example 15 | 0 | 6 | Plating | 180 | 5 h | 4 Excellent | 900 Bad | | 10 Excellent | 2000 or more Bad |
| Comp-Example 16 | 0 | 5 | Plating | 180 | 5 h | 39 Good | 2000 or more Bad | | 72 Good | 2000 or more Bad |

As apparent from Table 1 and Table 2, in each Example where the underlayer and the Sn—Ni alloy layer are disposed on the surface of the base, the contact resistance was low after the heating under atmosphere, and the corrosion resistance was excellent.

FIG. 3 and FIG. 4 show the cross-sectional image of the sample in Example 2 by STEM, and the result of the linear analysis by STEM, respectively. From the result of the linear analysis, it reveals that the X layer and the Y layer in the cross-sectional image are an Ni—Sn—Ni alloy layer and an Ni layer, respectively.

In each Example, no pure Sn layer was present at the surface of the Sn—Ni alloy layer.

On the other than, in each of Comparative Examples 1 and 3 where the Ni underlayer was thin, and $\{T_{Ni}-T_{Sn}\times(A_{Ni}/A_{Sn})\}<1700$, Cu in the base was diffused into the Sn—Ni alloy layer. Accordingly, the contact resistance of the alloy layer increased by heating, and the corrosion resistance was poor, too.

In Comparative Example 2 where $T_{Sn}<500$ μg/dm² and the thickness of the Sn—Ni alloy layer was less than 30 nm, the contact resistance was increased both before and after heating, and the corrosion resistance was considerably poor.

In each of Comparative Examples 4 and 5 where no Ni underlayer was formed, Cu in the base was diffused into the Sn—Ni alloy layer. Accordingly, the contact resistance of the alloy layer was increased by heating, and the corrosion resistance was poor, too.

In each of Comparative Examples 6 and 8 where Sn was excess relative to Ni and $\{T_{Ni}-T_{Sn}\times(A_{Ni}/A_{Sn})\}<1700$, the contact resistance was increased after heating. In each of Comparative Examples 4 and 5 where no Ni underlayer was formed and each of Comparative Examples 6 and 8 where $\{T_{Ni}-T_{Sn}\times(A_{Ni}/A_{Sn})\}<1700$, Sn was excess relative to Ni, and pure Sn remained on the outermost surface of the Sn alloy layer.

In Comparative Example 7 where Cu was used for the underlayer in place of Ni, the contact resistance after heating was increased, and the corrosion resistance was poor, too.

In each of Comparative Examples 4 to 8 where the second layer (Sn layer) 31 was plated by the method shown in FIG. 1(a), and no thermal treatment was performed. However, the Sn—Cu alloy layer or the Sn—Ni alloy layer was formed.

In Comparative Example 9 where no Sn—Ni alloy layer was formed, and only the underlayer was formed, the corrosion resistance was considerably poor.

In Comparative Example 10 where the Sn—Ni—Cu alloy layer was formed in place of the Sn—Ni alloy layer, the contact resistance was increased after heating, and the corrosion resistance was poor, too.

In Comparative Example 11 where the percentage of Sn in the Sn—Ni alloy layer was less than 20%, the corrosion resistance was poor.

In Comparative Example 12 where the percentage of Sn in the Sn—Ni alloy layer exceeded 80%, the contact resistance was increased by heating, and the corrosion resistance was poor, too.

In Comparative Example 13 where the underlayer became too thick, and $T_{Ni}$ exceeded 236000 μg/dm², the Sn—Ni alloy layer became too thick and could not fully follow the flexibility of the base, thereby easily generating cracks, and the corrosion resistance was poor.

In Comparative Example 14 where $T_{Sn}$ exceeded 91000 μg/dm², the Sn—Ni alloy layer became too thick and could not fully follow the flexibility of the base, thereby easily generating cracks, and the corrosion resistance was poor.

In Comparative Example 15 where $\{T_{Ni}-T_{Sn}\times(A_{Ni}/A_{Sn})\}$ exceeded 170000, the underlayer became too thick and could not fully follow the flexibility of the base, thereby easily generating cracks, and the corrosion resistance was poor.

In Comparative Example 16 where $T_{Ni}<2200$ μg/dm², and the thickness of the Sn—Ni alloy layer was less than 30 nm, the contact resistance was increased both before and after heating, and the corrosion resistance was considerably poor.

DESCRIPTION OF REFERENCE NUMERALS 1 metal foil
2 underlayer
3 Sn—Ni alloy layer
4 resin layer or resin film
10 metal foil for electromagnetic shielding
100 electromagnetic shielding material

What is claimed is:

1. A metal foil for electromagnetic shielding, comprising a base consisting of a metal foil, an underlayer including Ni formed on one or both surfaces of the base, and a Sn—Ni alloy layer including 2 weight % or less of constituent elements of the base to Sn—Ni formed on a surface of the underlayer, wherein a pure Sn layer is not present at the surface of the Sn—Ni alloy layer, when the surface of the Sn—Ni alloy layer is observed by SEM, the surface of the Sn—Ni alloy layer has no plurality of aciculate or columnar protrusions having an average diameter of 0.1 to 2.0 μm that is an average value of diameters of minimum circles surrounding convex parts of the respective protrusions, the Sn—Ni alloy layer includes 20 to 80 weight % of Sn, and when a total deposition amount of Sn is represented by $T_{sn}$ [μg/dm$^2$], the percentage of Sn in the Sn—Ni alloy is represented by $A_{Sn}$ [weight %], a total deposition amount of Ni is represented by $T_{Ni}$ [μg/dm$^2$], and the percentage of Ni in the Sn—Ni alloy is represented by $A_{Ni}$ [weight %], $T_{Sn}$: 500 to 91000 μg/dm$^2$, $T_{Ni}$: 2200 to 236000 μg/dm$^2$, 170000 => $\{T_{Ni} - T_{sn} \times (A_{Ni}/A_{sn})\}$ => 1700.

2. The metal foil for electromagnetic shielding according to any claim 1, wherein the base is gold, silver, platinum, stainless steel, iron, nickel, zinc, copper, a copper alloy, aluminum or an aluminum alloy.

3. The metal foil for electromagnetic shielding according to claim 1, wherein the base is aluminum or an aluminum alloy, and a Zn layer is formed between the base and the underlayer.

4. An electromagnetic shielding material, comprising a resin layer laminated on one surface of the metal foil for electromagnetic shielding according to claim 1.

5. The electromagnetic shielding material according to claim 4, wherein the resin layer is a resin film.

6. A shielded cable shielded by the electromagnetic shielding material according to claim 4.

7. A shielded cable shielded by the electromagnetic shielding material according to claim 5.

* * * * *